United States Patent
Sun et al.

(10) Patent No.: US 11,469,100 B2
(45) Date of Patent: Oct. 11, 2022

(54) METHODS OF POST TREATING DIELECTRIC FILMS WITH MICROWAVE RADIATION

(71) Applicant: Applied Materials, Inc., Santa Clara, CA (US)

(72) Inventors: Yong Sun, San Jose, CA (US); Praket Prakash Jha, San Jose, CA (US); Jingmei Liang, San Jose, CA (US); Martin Jay Seamons, San Jose, CA (US); DongQing Li, Fremont, CA (US); Shashank Sharma, Fremont, CA (US); Abhilash J. Mayur, Salinas, CA (US); Wolfgang R. Aderhold, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 182 days.

(21) Appl. No.: 16/817,007

(22) Filed: Mar. 12, 2020

(65) Prior Publication Data
US 2020/0381248 A1   Dec. 3, 2020

Related U.S. Application Data

(60) Provisional application No. 62/854,638, filed on May 30, 2019.

(51) Int. Cl.
| | |
|---|---|
| H01L 21/02 | (2006.01) |
| C23C 16/30 | (2006.01) |
| C23C 16/455 | (2006.01) |
| C23C 16/50 | (2006.01) |
| H01L 21/67 | (2006.01) |
| H01J 37/32 | (2006.01) |

(52) U.S. Cl.
CPC ...... *H01L 21/02345* (2013.01); *C23C 16/308* (2013.01); *C23C 16/45565* (2013.01); *C23C 16/50* (2013.01); *H01L 21/0214* (2013.01); *H01L 21/0217* (2013.01); *H01L 21/02126* (2013.01); *H01L 21/02164* (2013.01); *H01L 21/02167* (2013.01); *H01L 21/02271* (2013.01); *H01J 37/3244* (2013.01); *H01J 2237/3321* (2013.01); *H01L 21/67167* (2013.01); *H01L 21/67207* (2013.01)

(58) Field of Classification Search
None
See application file for complete search history.

(56) References Cited

U.S. PATENT DOCUMENTS

| | | | |
|---|---|---|---|
| 7,557,035 B1 | 7/2009 | Ryan et al. | |
| 7,589,028 B1 * | 9/2009 | Cho | H01L 21/02145 257/E21.576 |
| 9,362,107 B2 | 6/2016 | Thadani et al. | |
| 2014/0017895 A1 | 1/2014 | Chan et al. | |

(Continued)

OTHER PUBLICATIONS

International Search Report dated Jul. 31, 2020 for Application No. PCT/US2020/027972.

*Primary Examiner* — Asok K Sarkar
(74) *Attorney, Agent, or Firm* — Patterson + Sheridan, LLP

(57) ABSTRACT

A method of post-treating a dielectric film formed on a surface of a substrate includes positioning a substrate having a dielectric film formed thereon in a processing chamber and exposing the dielectric film to microwave radiation in the processing chamber at a frequency between 5 GHz and 7 GHz.

8 Claims, 14 Drawing Sheets

(56) References Cited

U.S. PATENT DOCUMENTS

2014/0017904 A1 1/2014 Gauri et al.
2014/0302689 A1 10/2014 Ashtiani et al.
2015/0279705 A1* 10/2015 Iwai .................. H05B 6/806
　　　　　　　　　　　　　　　　　　　　　　438/795

* cited by examiner

FTIV

IV

METHODS OF POST TREATING DIELECTRIC FILMS WITH MICROWAVE RADIATION

CROSS-REFERENCE TO RELATED APPLICATIONS

This application claims the benefit to U.S. Provisional Application No. 62/854,638, filed May 30, 2019, which is incorporated by reference herein.

BACKGROUND

Field

Embodiments of the present disclosure generally relate to dielectric films and fabrication processes thereof, more specifically, to post-treating dielectric films with microwave radiation.

Description of the Related Art

In fabrication of miniaturized semiconductor devices, including shallow trench isolation (STI), inter-metal dielectric (IMD) layers, inter-layer dielectric (ILD) layers, pre-metal dielectric (PMD) layers, passivation layers, and the like, it is necessary to fill high aspect ratio gaps with insulating materials. As feature sizes of transistors, as well as spaces between them, have gone down to 20 nm or below and thermal budgets are reduced, void-free filling of such minute and high aspect ratio features is becoming increasingly challenging. In flowable chemical vapor deposition (CVD), dielectric precursor in a liquid phase is delivered into gaps and trenches on a substrate, and then hardened into a dielectric film in a solid phase (referred to as a flowable film, a flowable CVD dielectric film, or gap-fill film), conventionally by steam annealing, ultraviolet (UV) irradiation, hot pressing, and sintering at high temperatures. In many instances, such solidification processes provide thermal energy to the dielectric precursor, causing prematurely solidifying the dielectric film (thus causing shrinkage of the dielectric film and/or forming seams and voids in the dielectric film), and/or oxidizing underlying metals in the substrate by heated water vapor. Furthermore, the solidification processes due to thermal energy cause non-uniformity in the direction of thickness of the dielectric film and may treat only near a surface of the dielectric film. Therefore, a new solidification process is needed to form gap-fill dielectric films that are soft having a low modulus and viscosity to ensure void-free filling of gaps and trenches with low thermal budget requirements.

Furthermore, there is a need for dielectric films having improved mechanical properties, such as an improved wet etch rate (WERR, <2:1), relative to thermal oxide film, and a dielectric constant equal to or less than that of thermal oxide, and low internal stress.

SUMMARY

Embodiments described herein generally related to a method of post-treating a dielectric film formed on a surface of a substrate that includes positioning a substrate having a dielectric film formed thereon in a processing chamber and exposing the dielectric film to microwave radiation in the processing chamber at a frequency between 5 GHz and 7 GHz.

Embodiments of the disclosure may further provide a method of forming and post-treating a dielectric film on a surface of a substrate that includes delivering a dielectric precursor onto a substrate disposed in a processing region of a first chamber, providing radical flux in the processing region of the first chamber, and exposing the delivered dielectric precursor to microwave radiation at a frequency between 5 GHz and 7 GHz.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Embodiments described herein provide methods of post-treating a dielectric film formed on a substrate, for example, by flowable CVD. A dielectric film may be a low-k SiCOH-based film that contains silicon-carbon-oxygen (Si—C—O) bonds, a SiCON-based film that contains silicon-carbon-and-hydrogen (Si—C—H) bond, or a SiO based film. The dielectric film, as deposited on the substrate, contains a large amount of hydroxyl groups (—OH) that may cause aging (i.e., absorb moisture) and decrease densities and strength of the film. The methods described herein include post-treating a dielectric film formed on a surface of a substrate that includes positioning a substrate having a dielectric film formed thereon in a processing chamber and exposing the dielectric film to microwave radiation in the processing chamber at a frequency between 5 GHz and 7 GHz. The methods described herein can be used to reduce or eliminate the amount of hydroxyl groups (—OH) in formed dielectric films by exposure to microwave radiation, while preventing shrinkage of the dielectric films due to heat convection.

Embodiments described herein also provide methods of forming a dielectric film (e.g., SiCOH, $SiO_x$, SiC, SiCO, SiCON, SiCN, $SiN_x$) by flowable CVD to fill gaps having high aspect ratio (AR) and small dimensions (e.g., AR≥8). In some embodiments, dielectric films formed by flowable CVD are seam-free and can fill up high AR trenches. In some embodiments, dielectric films containing high carbon content can be used in hard mask and low-k flowable applications. In some embodiments, dielectric films are deposited using a dielectric precursor in a liquid phase and radical forms of co-reactants (reactive gas), for example, oxygen ($O_2$) or ammonia ($NH_3$).

Figure 1:
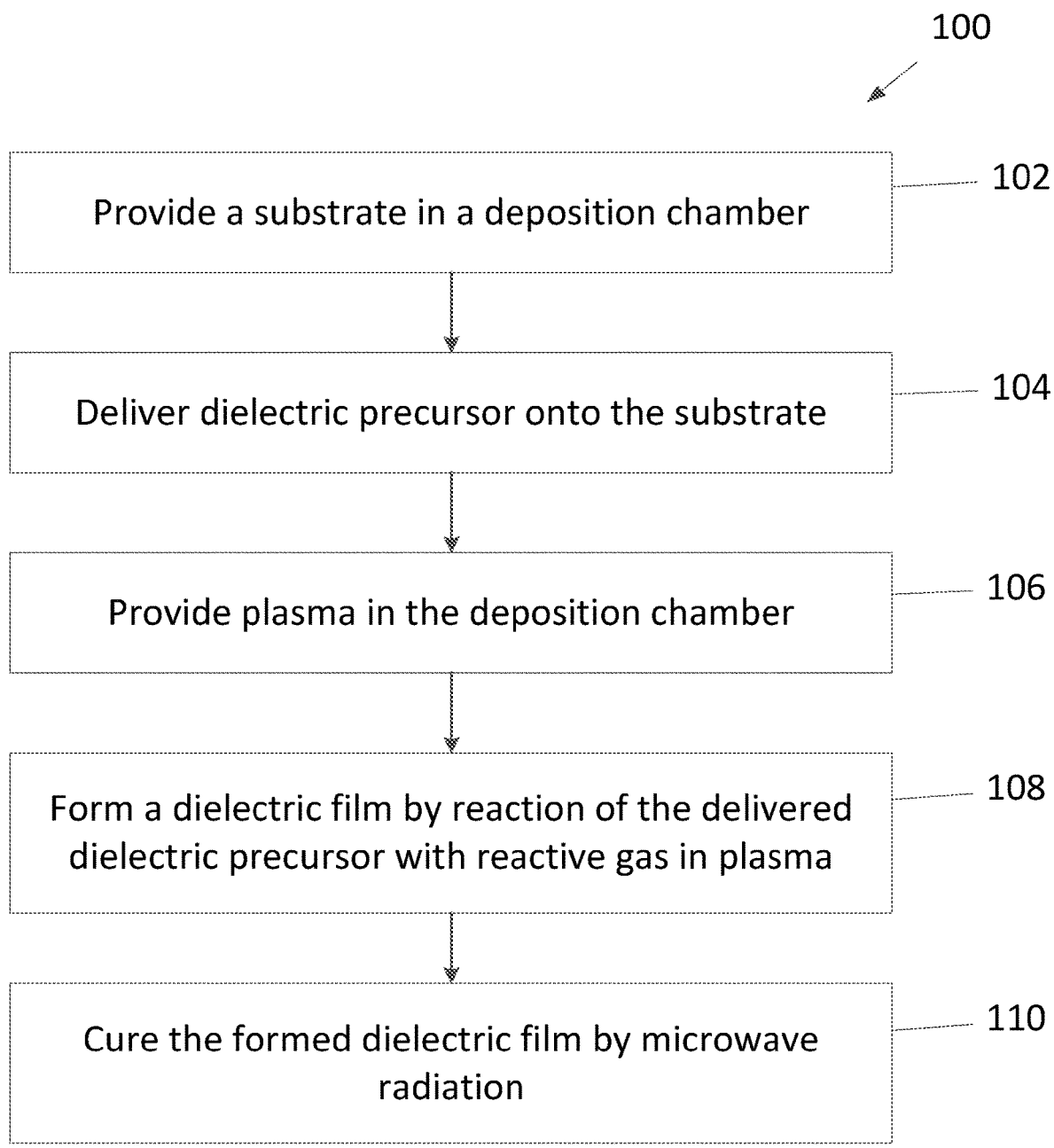
FIG. 1 is a flowchart showing a method of forming a dielectric film according to one embodiment.

FIG. 1 is a flowchart illustrating a method 100 that is used to form a dielectric film on a surface of a substrate, according to one embodiment.

In block 102, a substrate is provided in a deposition chamber. A substrate, for example, may be a metal substrate, such as aluminum or stainless steel, a semiconductor substrate, such as silicon, silicon-on-insulator (SOI), or gallium arsenide, a glass substrate, or a plastic substrate. A semiconductor substrate may be a patterned substrate at any stage of manufacture/fabrication in the formation of integrated circuits. The patterned substrate may include gaps, trenches, holes, vias, or the like, that are to be filled with dielectric material.

In block 104, one or more dielectric precursors in a liquid phase and a carrier gas, such as argon (Ar) or helium (He), are flowed into the deposition chamber via a gas delivery device, such as a dual channel showerhead (DCSH), to deliver the dielectric precursor onto a surface of the substrate disposed within the deposition chamber at a flow rate between about 250 sccm and about 5000 sccm per channel of the DSCH. The surface of the substrate can be held at a reduced temperature of between about 40° C. and about 150° C., for example at about 80° C. A pressure of the deposition chamber may be maintained between about 0.5 Torr and about 3.0 Torr.

In some embodiments, the dielectric precursor is an organosilicon compound that includes silicon, carbon, and hydrogen, such as silane, disilane, methylsilane, dimethylsilane, trimethylsilane, tetramethylsilane, tetraethoxysilane (TEOS), triethoxysilane (TES), octamethylcyclotetrasiloxane (OMCTS), tetramethyl-disiloxane (TMDSO), tetramethylcyclotetrasiloxane (TMCTS), tetramethyl-diethoxydisiloxane (TMDDSO), dimethyl-dimethoxy-silane (DMDMS), or combinations thereof. In some embodiments, the dielectric precursor is an organosilicon compound that includes silicon, nitrogen, hydrogen, and chlorine, such as silyl-amine and its derivatives including trisilylamine (TSA) and disilylamine (DSA), an organosilicon compound that includes silicon, nitrogen, hydrogen, and oxygen, or a combination thereof.

In block 106, a plasma may be generated outside the deposition chamber and flowed into a processing region of the deposition chamber (remote plasma) along with a carrier gas (e.g., Ar, He) or within the deposition chamber (direct plasma). The plasma can be generated by the dissociation of a processing precursor gas including molecular oxygen ($O_2$), ozone ($O_3$), molecular hydrogen ($H_2$), a nitrogen-hydrogen compound (e.g., $NH_3$, $N_2H_4$) a nitrogen-oxygen compound (e.g., NO, $NO_2$, $N_2O$), a hydrogen-oxygen compound (e.g., $H_2O$, $H_2O_2$), a nitrogen-hydrogen-oxygen compound (e.g., $NH_4OH$), a carbon-oxygen compound (CO, $CO_2$), or a combination thereof. In a chamber plasma region, O*, H*, and/or N*-containing radicals may be activated, such as O*, H*, N*, $NH_3$*, $N_2H_4$*, $NH_2$*, NH*, N*O*, $C_3H_6$*, $C_2H_2$*, or a combination thereof.

In some embodiments, the radicals activated in plasma generated outside the deposition chamber in a remote plasma source (RPS) (referred to as "radical flux") are flowed into the deposition chamber at a flow rate between about 1 sccm and about 10000 sccm.

In some embodiments, a plasma may be generated within the deposition chamber in a capacitively coupled plasma (CCP) source, which is driven by a radio-frequency (RF) power supply. One of two electrodes is connected to the power supply and the other one is grounded. In some embodiments, a mesh is disposed within the deposition chamber between the CCP source and the substrate to prevent the delivered dielectric precursor from bombardment by the plasma.

In block 108, one or more radicals (also referred to as reactive gas) in the processing region react with the delivered dielectric precursor to form a dielectric film. The composition of the formed dielectric film can be adjusted by changing the composition of the reactive gas in the radical flux. To form an oxygen-containing film, such as SiO, SiC, SiOC, SiON, and SiCON, the reactive gas may be, for example, oxygen ($O_2$), ozone ($O_3$), or water ($H_2O$). To form a nitrogen-containing film, such as SiON, SiCON, and SiN films, the reactive gas may be, for example, ammonia ($NH_3$), hydrazine ($N_2H_4$), nitrogen dioxide ($NO_2$), or nitrogen ($N_2$). To form a carbon-containing film, the reactive gas may be, for example, propylene ($C_3H_6$) or acetylene ($C_2H_2$).

When oxygen ($O_2$) radicals in the processing region react with the delivered dielectric precursor, the delivered dielectric precursor is hydrophilized (i.e., hydroxyl groups (—OH) are attached to the organosilicon compounds). That is, oxygen ($O_2$) radicals in the deposition chamber cause replacement of methyl groups R (—$CH_3$) with hydroxyl groups (—OH) in the organosilicon compounds in the delivered dielectric precursor, forming silanol groups (Si—OH).

In block 110, the formed dielectric film is cured by exposure to microwave radiation in a microwave exposure chamber, causing cross-linking between compounds having hydroxyl groups (—OH) in the dielectric precursor, to form a cured film. That is, when the silanol groups (Si—OH) in adjacent compounds in the formed dielectric film react, the adjacent compounds cross-link by removing hydroxyl groups (—OH), forming siloxane functional group (Si—O—Si), and generating water ($H_2O$).

The removal of these hydroxyl groups (—OH) may decrease effects of aging and increase densities and strength of the cured film by reducing or eliminating seams and voids that lead to leakage currents. In addition, the removal of the hydroxyl groups (—OH) may lower dielectric constant of the film as required by many device applications.

While not intending to be bound by theory, it is believed that microwave radiation may non-thermally activate vibrational motions of hydroxyl groups (—OH) within the dielectric film, thereby breaking the O—H bonds and reducing or eliminating silanol groups (Si—OH). This treatment by microwave radiation is non-thermal unlike thermal annealing or UV irradiation, which inevitably provides thermal energy to the dielectric film, causing prematurely solidifying the dielectric film (thus shrinkage of the cured film) and/or oxidizing underlying metals in the substrate by the heated water vapor. In the treatment by microwave radiation, low substrate temperatures may be maintained throughout microwave radiation in accordance with low thermal budget requirements of many applications, and thus the dielectric precursors remain flowable, soft, and malleable.

In the treatment by microwave radiation, microwave frequencies vary between about 5 GHz and 7 GHz, such as 5.8 GHz. Density and thickness of a cured film after exposure to microwave radiation vary as microwave frequencies vary.

Microwave power and exposure time required for removing hydroxyl groups (—OH) are correlated with each other (i.e., a higher power requires a shorter exposure time). Microwave power density may range between about 0.7 W/cm$^2$ and 7.0 W/cm$^2$. Microwave exposure times may range from below about 1 minute to about 120 minutes, for example, from about 1 minute to about 20 minutes, or from about 5 minutes to about 10 minutes. Microwave power should be high enough and exposure time long enough to remove hydroxyl groups (—OH), increase density, and lower dielectric constant in the cured film, as desired. However, a reduced exposure time with a higher microwave power may decrease a process time in commercial applications.

During the exposure to microwave radiation, the substrate may be disposed on a substrate pedestal (shown in FIG. 4) that is maintained at room temperature and the substrate temperature may range between room temperature and about 450° C. The use of microwave radiation allows for lower thermal budgets than thermal annealing since heat is not transferred by heat convection. In some embodiments, the substrate pedestal is connected to a heater to adjust the temperature of the substrate.

Pressure during microwave radiation ranges from 0.01 to 760 Torr (atmospheric pressure), for example atmospheric pressure. The microwave radiation occurs in an inert environment, including an inert gas such as helium, or argon, in the microwave exposure chamber. In some embodiments, microwave exposure is performed in ambient gas, including oxygen, air, or water vapor. In yet other embodiments, a reactive gas environment such as $H_2$, $N_2$, $NH_3$, $CO_2$, CO are used.

The microwave radiation may be applied continuously or pulsed. In some embodiments, the microwave radiation is applied in transverse electric (TE) and/or transverse magnetic (TM) mode.

Figure 2:
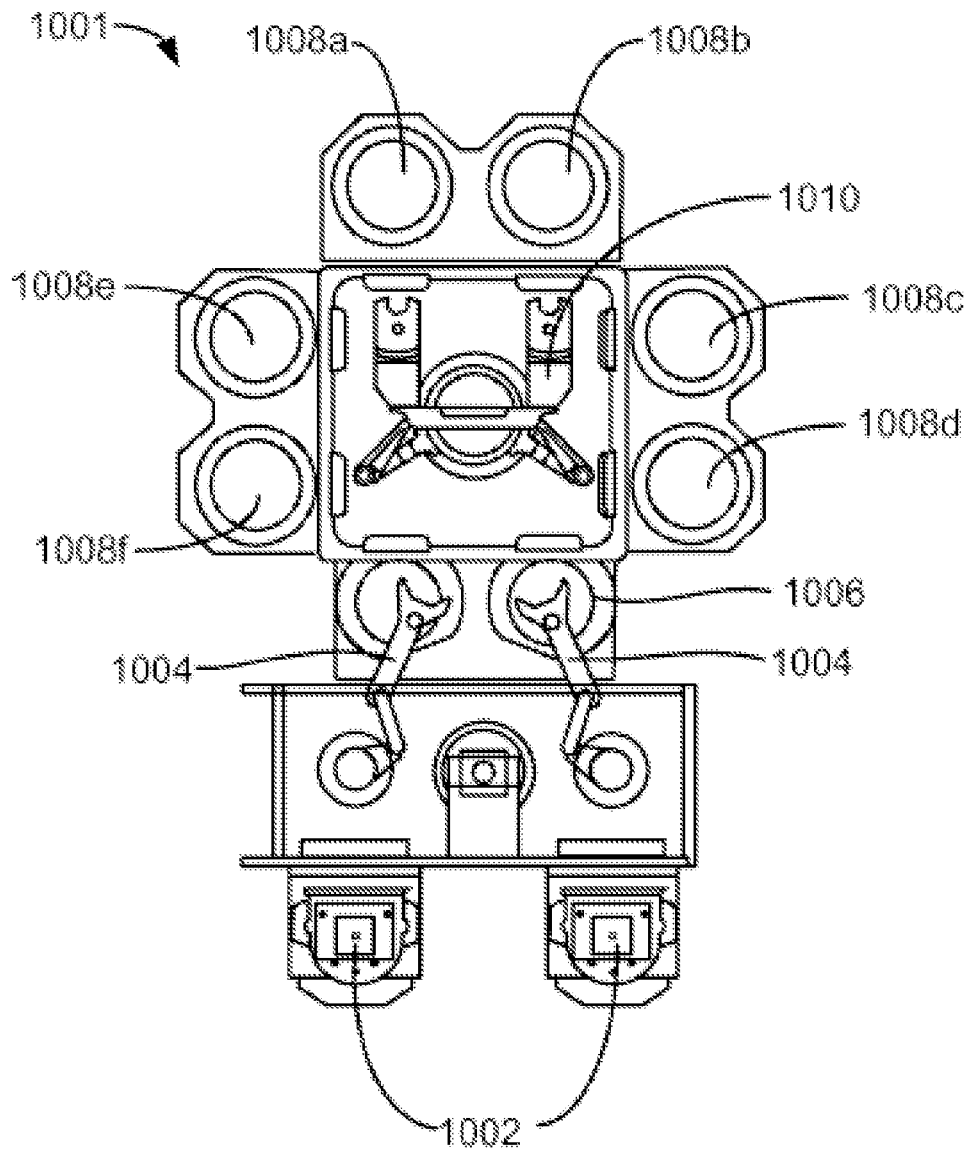
FIG. 2 is a schematic view of a system of processing chambers according to one embodiment.

Embodiments of the deposition systems may be incorporated into larger fabrication systems for producing integrated circuit chips. FIG. 2 shows one such system 1001 that includes processing chambers 1008a-f, according to one embodiment. In FIG. 2, a pair of front opening unified pods (FOUPs) 1002 supply substrates (e.g., 300 mm diameter wafers) that are received by robotic arms 1004 and placed into a low pressure holding area 1006. A second robotic arm 1010 may be used to transport the substrate between the low pressure holding area 1006 and the processing chambers 1008a-f.

The processing chambers 1008a-f may include one or more system components for depositing a dielectric film on the substrate. In some embodiments, a pair of processing chambers (e.g., 1008a-b) may be used as the deposition chamber for delivering dielectric precursor on the substrate. Thus, in some embodiments, the system 1001 is adapted to perform method 100 by performing blocks 102-108 of the method 100 on a substrate that is positioned in the pair of processing chambers (e.g., 1008a-b), transferring the substrate to the microwave exposure chamber disposed outside the system 1001, where block 110 is performed on the substrate.

The system 1001 further includes a system controller 302 which is used to control the operation of the system 1001 and implement the methods set forth herein. The system controller 302 includes a programmable central processing unit, herein the central processing unit (CPU) 304, that is operable with a memory 306 (e.g., non-volatile memory) and support circuits 308. The support circuits 308 are coupled to the CPU 304 and comprise cache, clock circuits, input/output subsystems, power supplies, and combinations thereof coupled to the various components of the system 1001, to facilitate control thereof. The CPU 304 is one of any form of general purpose computer processor, such as a programmable logic controller (PLC), for controlling various components and sub-processors of the system 1001. The memory 306, coupled to the CPU 304, is non-transitory and is typically one or more of readily available memories such as random access memory (RAM), read only memory (ROM), floppy disk drive, hard disk, or any other form of digital storage, local or remote.

Figure 3A:
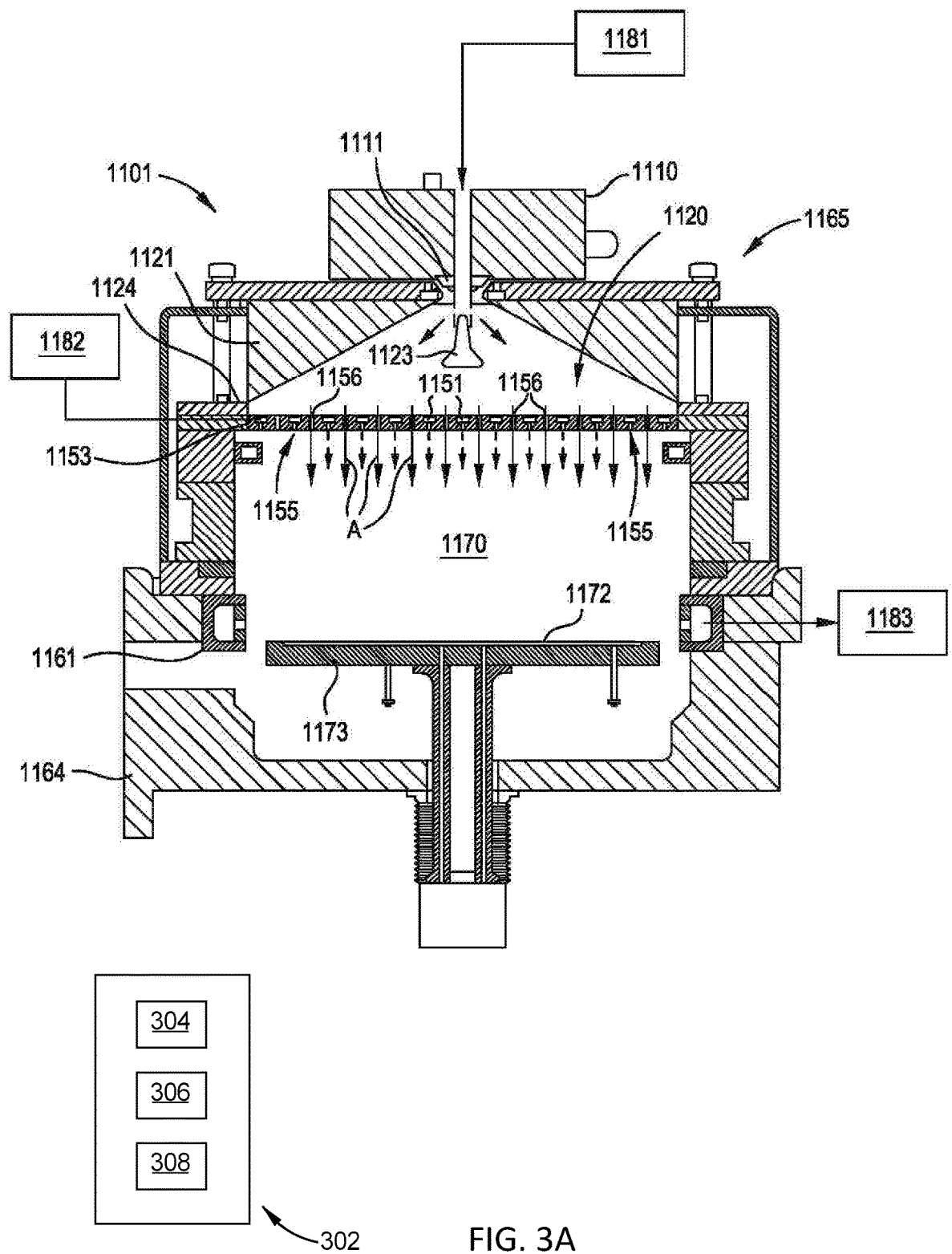
FIG. 3A is a schematic side cross-sectional view of a deposition chamber according to one embodiment.

FIG. 3A is a schematic view of a processing chamber 1101 having a chamber body 1164 and lid assembly 1165, according to one embodiment. The lid assembly 1165 generally includes a remote plasma source 1110, a lid 1121, and a dual channel showerhead (DCSH) 1153. The remote plasma source (RPS) 1110 may process a processing precursor gas provided from a processing precursor gas source 1181. The plasma formed in the RPS 1110 may be then delivered through a gas inlet assembly 1111 and baffle 1123, which are coupled to the lid 1121, and into a chamber plasma region 1120. A carrier gas (e.g., Ar, He) may be delivered into the chamber plasma region 1120. The lid (that is a conductive top portion) 1121 and the dual channel showerhead (DCSH) 1153 are disposed with an insulating ring 1124 in between, which allows an AC potential to be applied to the lid 1121 relative to the DCSH 1153.

The DCSH 1153 is disposed between the chamber plasma region 1120 and a substrate processing region 1170 and allows radicals activated in the plasma present within the chamber plasma region 1120 to pass through a plurality of through-holes 1156 into the substrate processing region 1170. The flow of the radicals (radical flux) is indicated by the solid arrows "A" in FIG. 3A. A substrate 1172 is disposed on a substrate support 1173 disposed within the substrate processing region 1170. The DCSH 1153 also has one or more hollow volumes 1151 which can be filled with a dielectric precursor provided from a precursor source 1182. The dielectric precursor passes from the one or more hollow volumes 1151 through small holes 1155 and into the substrate processing region 1170, bypassing the chamber plasma region 1120. The flow of the dielectric precursor is indicated by the dotted arrows in FIG. 3A. An exhaust ring 1161 is used to uniformly evacuate the substrate processing region 1170 by use of an exhaust pump 1183. The DCSH 1153 may be thicker than the length of the smallest diameter of the through-holes 1156. The length of the smallest diameter 1150 of the through-holes may be restricted by forming larger diameter portions of through-holes 1156 partially through the DCSH 1153, to maintain a flow of radical flux from the chamber plasma region 1120 into the substrate processing region 1170. In some embodiments, the length of the smallest diameter of the through-holes 1156 may be the same order of magnitude as the smallest diameter of the through-holes 1156 or less.

In some embodiments, a pair of processing chambers (e.g., 1008c-d) in FIG. 2 (referred to as a twin chamber) may be used to deposit a dielectric precursor on the substrate. Each of the processing chambers (e.g., 1008c-d) can have a cross-sectional structure of the processing chamber 1101 depicted in FIG. 3A. The flow rates per channel of the DCSH described above correspond to flow rates into each of the chambers (e.g., 1008c-d) via the corresponding DCSH 1153.

Figure 3B:
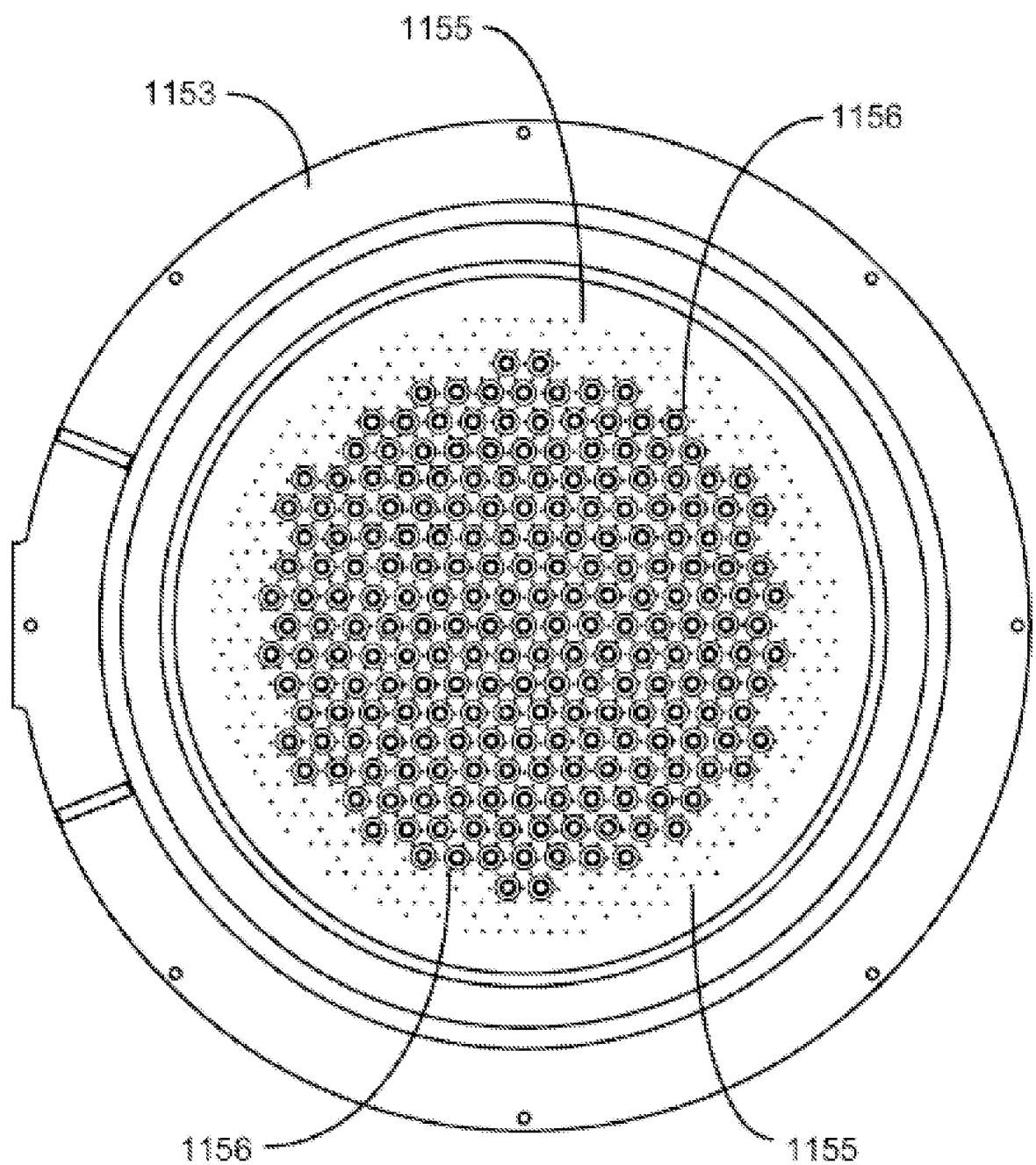
FIG. 3B is a schematic bottom view of a shower head according to one embodiment.

FIG. 3B is a schematic bottom view of the DCSH 1153 according to one embodiment. The DCSH 1153 may deliver via through-holes 1156 the radical flux and the carrier gas present within the chamber plasma region 1120.

In some embodiments, the number of through-holes 1156 may be between about 60 and about 2000. Through-holes 1156 may have round shapes or a variety of shapes. In some embodiments, the smallest diameter of through-holes 1156 may be between about 0.5 mm and about 20 mm or between about 1 mm and about 6 mm. The cross-sectional shape of through-holes may be made conical, cylindrical or a combination of the two shapes. In some embodiments, a number of small holes 1155 may be used to introduce a dielectric precursor into the substrate processing region 1170 and may be between about 100 and about 5000 or between about 500 and about 2000. The diameter of the small holes 1155 may be between about 0.1 mm and about 2 mm.

Figure 4:
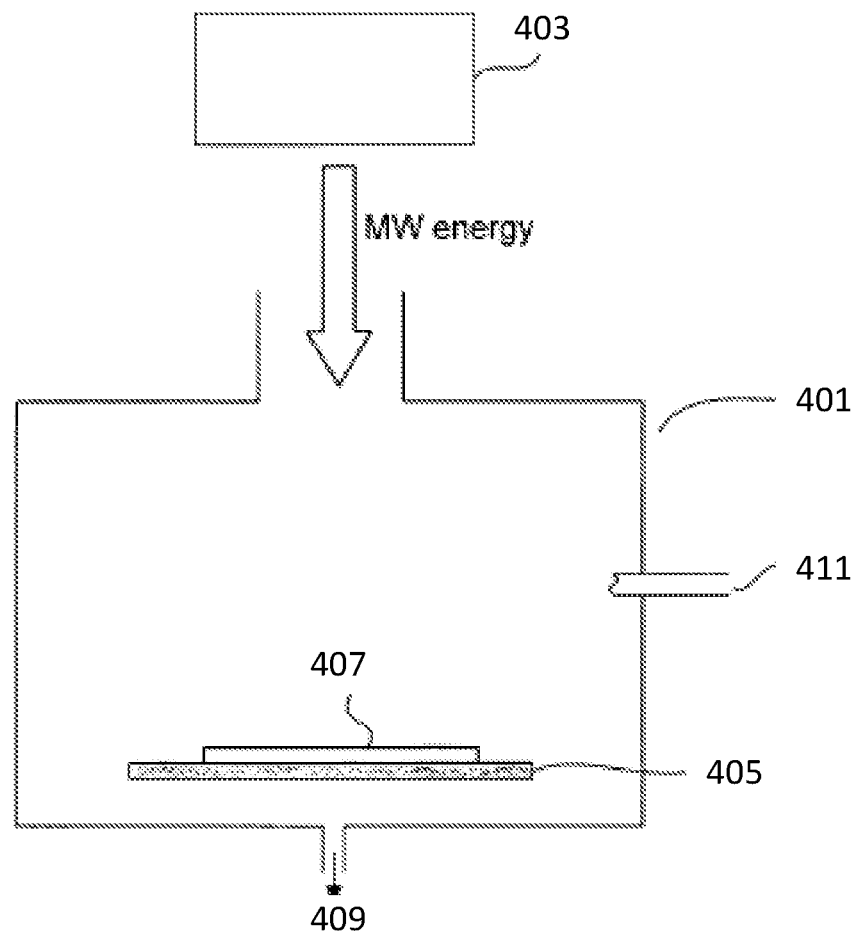
FIG. 4 is a schematic view of a microwave exposure chamber according to one embodiment.

FIG. 4 is a schematic view of a microwave exposure chamber 401 according to one embodiment. The microwave exposure chamber 401 may be maintained at vacuum and/or contain gas at pressures above atmospheric pressure. A microwave source 403 is positioned outside the microwave exposure chamber 401.

The microwave exposure chamber 401 includes a substrate pedestal 405 that supports a substrate 407 in a position such that the substrate 407 can be irradiated by radiation from the microwave source 403. The substrate pedestal 405 may be rotatable and made of quartz. The microwave exposure chamber 401 may have a heater (not shown) to adjust the temperature of the substrate 407. The microwave exposure chamber 401 includes a gas inlet 409 that is connected to a gas source (not shown) and a vacuum outlet 411 that is connected to a vacuum pump (not shown). The microwave exposure chamber 401 further includes valves and mass flow controller (not shown) for adjusting gas flow from the gas source into the microwave exposure chamber 401 and a pressure gauge (not shown) for measuring pressure in the microwave exposure chamber 401.

In the example shown in FIG. 4, the microwave source 403 is positioned outside the microwave exposure chamber 401. In some embodiments, the microwave source 403 is housed within the microwave exposure chamber 401.

In block 110 of the method 100 described above, the microwave exposure chamber 401 is first evacuated via the vacuum outlet 411, and then the ambient gas, such as nitrogen, helium, argon, hydrogen, oxygen, air, or water vapor, is introduced via the gas inlet 409 to a certain chamber pressure or maintained at vacuum. Subsequently, the microwave source 403 is turned on to irradiate the substrate 407 with microwave radiation to cure in dielectric films. The microwave exposure chamber 401 may be at atmospheric pressure to remove any volatilized residues or under continuous purge to remove any of residual gases from the microwave exposure. Ambient gas is again introduced via the gas inlet 409 or the microwave exposure chamber 401 is maintained at vacuum. The microwave source 403 is turned or left on to further treat the cured film to remove hydroxyl groups (—OH) for a desired time duration and then the substrate 407 is removed from the microwave exposure chamber 401.

In the following, experimental measurements of example dielectric films are provided to illustrate aspects of the embodiments of the disclosure described herein. These examples are not intended to limit the scope of the present disclosure.

EXAMPLE 1

A carbon-doped low-k SiCOH-based flowable dielectric film was formed on a substrate using an organosilicon compound that includes silicon, carbon, hydrogen, and oxygen, as the dielectric precursor and oxygen-containing plasma generated in a CCP source by the method 100 described above.

Figure 5A:
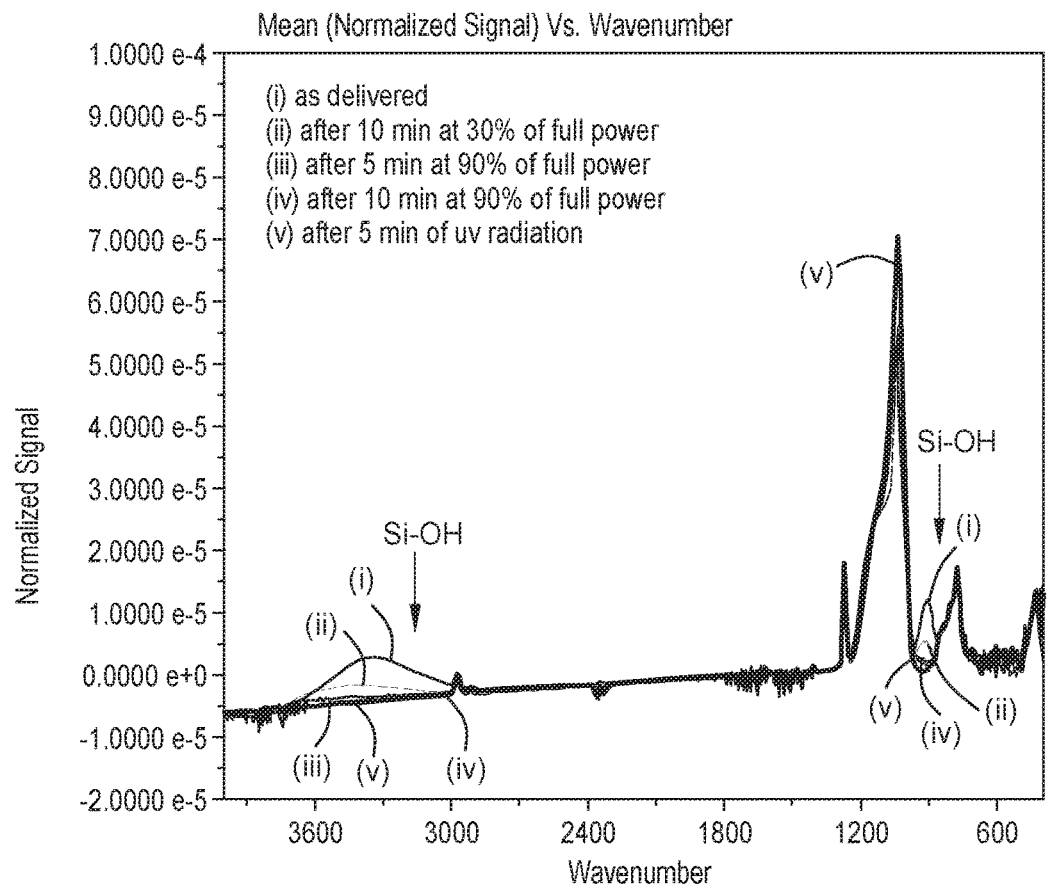
FIGS. 5A, 5B, 5C show Fourier-Transform infrared (FTIR) spectra, leak current, and reflective index/shrinkage of a flowable film according to one embodiment.

The formed flowable film was then exposed to microwave radiation at 5.8 GHz in nitrogen ambient at atmospheric pressure at room temperature. In FIG. 5A, Fourier-Transform infrared (FTIR) spectra of the flowable film (i) as delivered, (ii) after 10 minutes of exposure to microwave radiation at 30% of full power (1.6 kW), (iii) after 5 minutes of exposure to microwave radiation at 90% of full power, (iv) after 10 minutes of exposure to microwave radiation at 90% of full power, and (v) after 5 minutes of exposure to UV radiation at 385° C. is shown. The peaks in the range of 3400-3200 $cm^{-1}$ correspond to the vibration frequency of hydrogen-bonded silanol groups (Si—OH). The silanol groups (Si—OH) show absorption in the range 950-810 $cm^{-1}$. As can be seen from FIG. 5A, the hydroxyl groups are completely eliminated (iv) after 10 minutes of exposure to microwave radiation at 90% of full power and (v) after 5 minutes of exposure to UV radiation at 385° C.

Figure 5B:
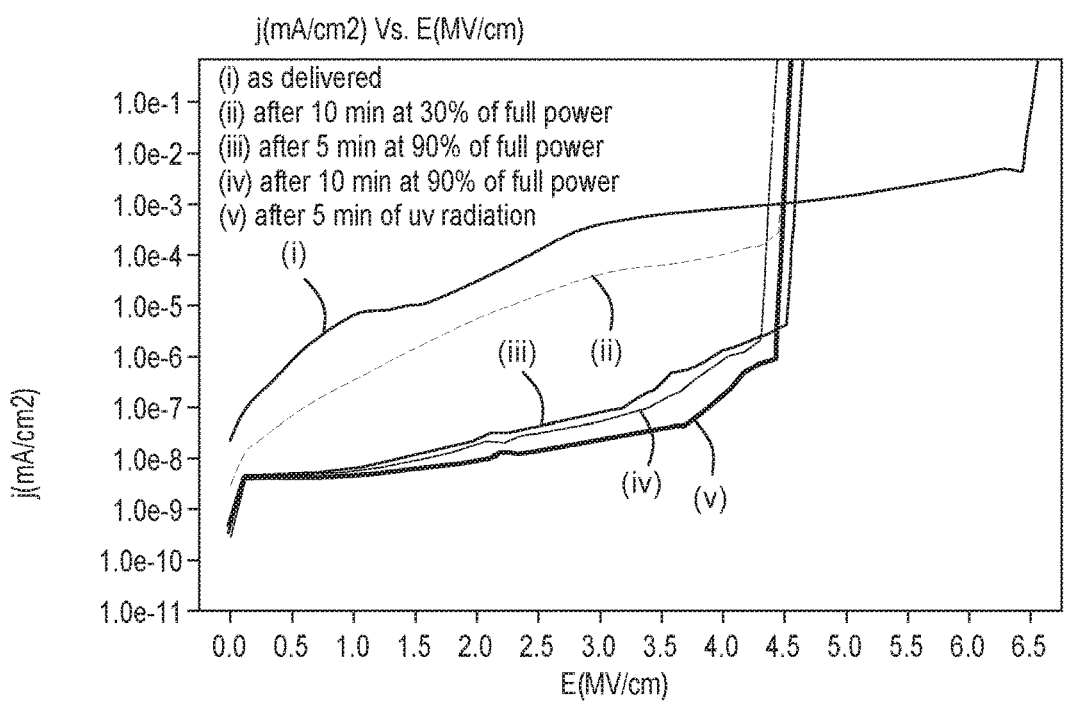
Figure 5C:
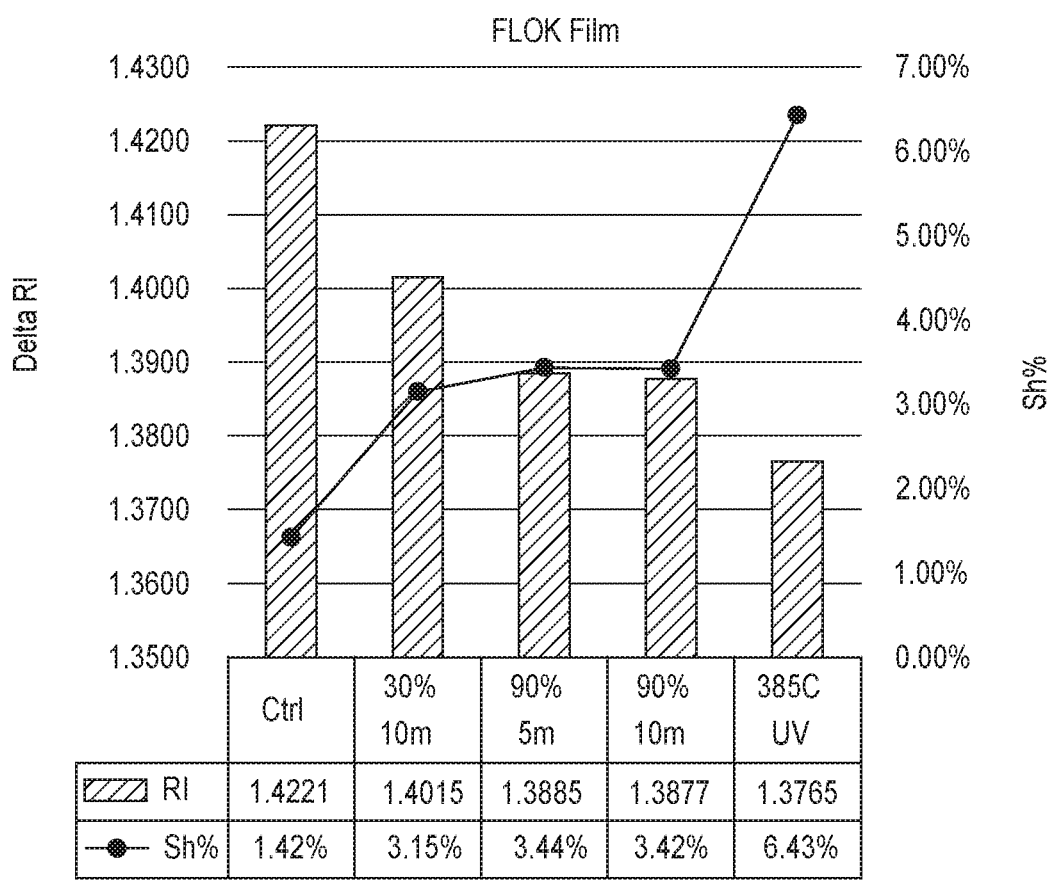

As can be seen in FIG. 5B, the exposure to microwave radiation lowers leak current at an applied electric field 2.0 mV/cm from $2.7 \times 10^{-5}$ $mA/cm^2$ in the flowable film (i) as delivered to $1.7 \times 10^{-8}$ $mA/cm^2$ in a middle region of the flowable film, as well as (v) the exposure to UV radiation at 385° C. for 5 minutes lowers the leak current. Removing hydroxyl groups also increases the density of the film and thus film shrinkage is about 3.4% (iii) after 5 minutes and (iv) after 10 minutes of exposure to microwave radiation at 90% of full power as shown in FIG. 5C. However, this shrinkage is lower than the shrinkage (about 6.4%) of the dielectric flowable film cured by exposure to (v) UV radiation at 385° C. for 5 minutes. The reduction in the reflective index was 1.4221 to 1.3885 (iii) after 5 minutes and to 1.3765 (v) after the exposure to UV radiation at 385° C. for 5 minutes.

EXAMPLE 2

Figure 6A:
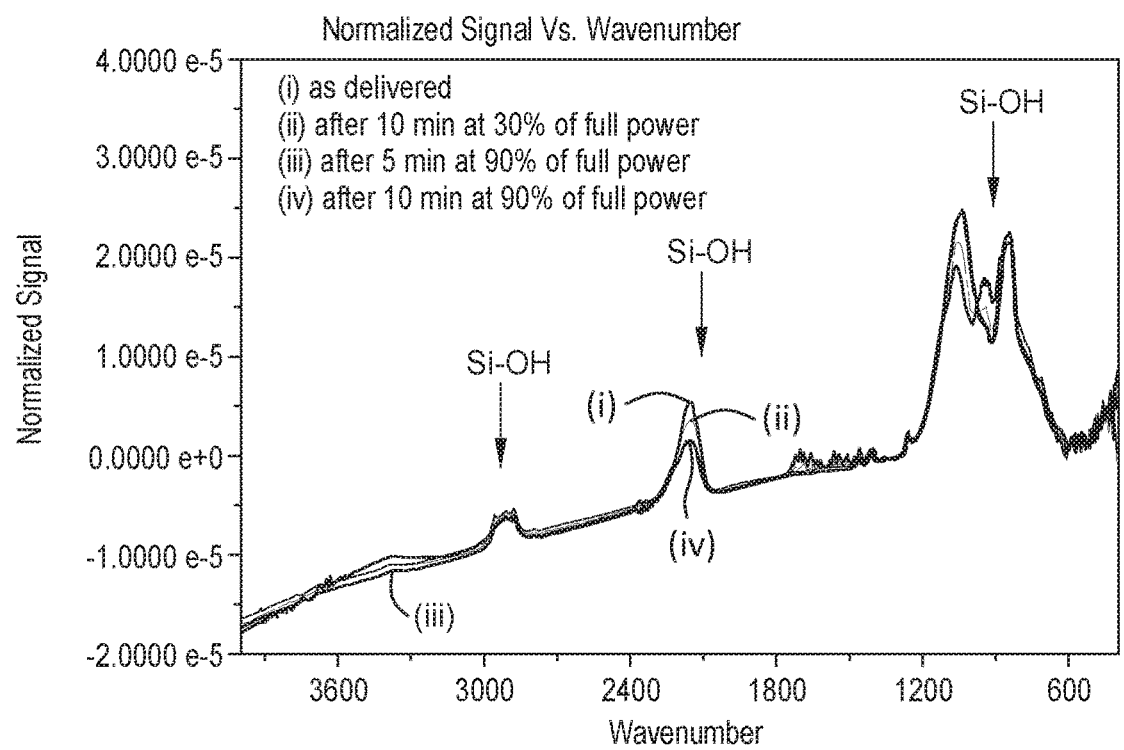
FIGS. 6A, 6B, 6C, 6D, 6E, 6F, 6G, 6H, 6I, and 6J show FTIR spectra and leak current of a flowable film according to one embodiment.
Figure 6B:
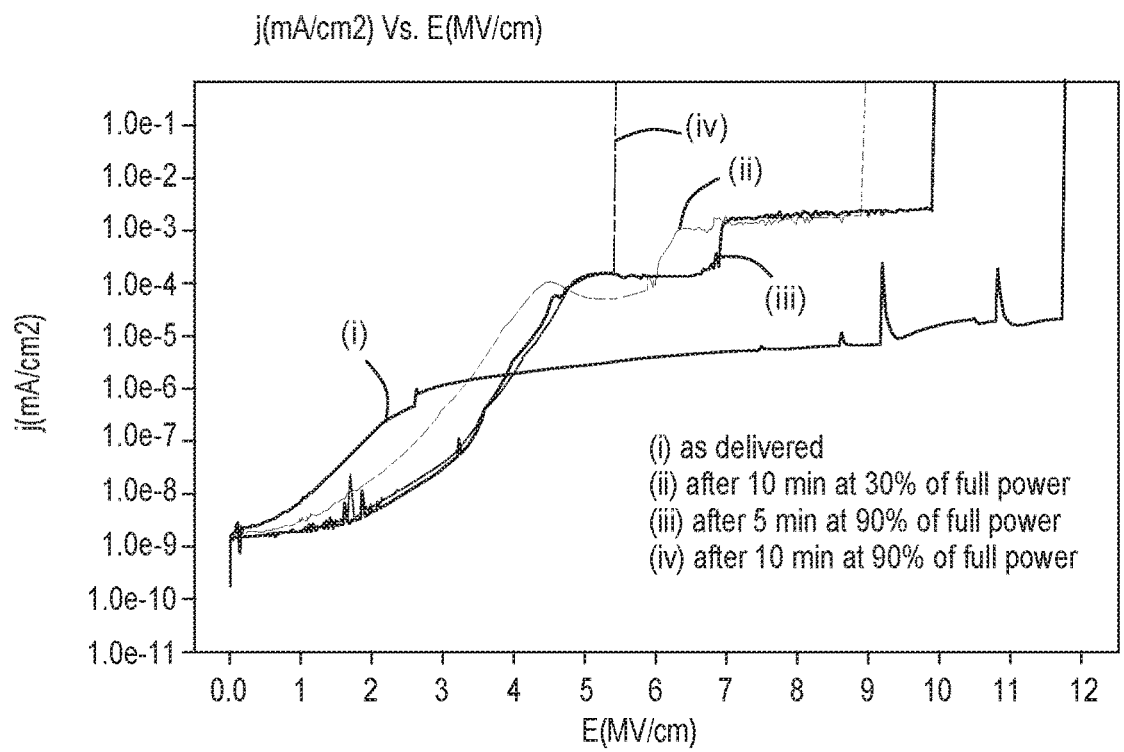
Figure 6C:
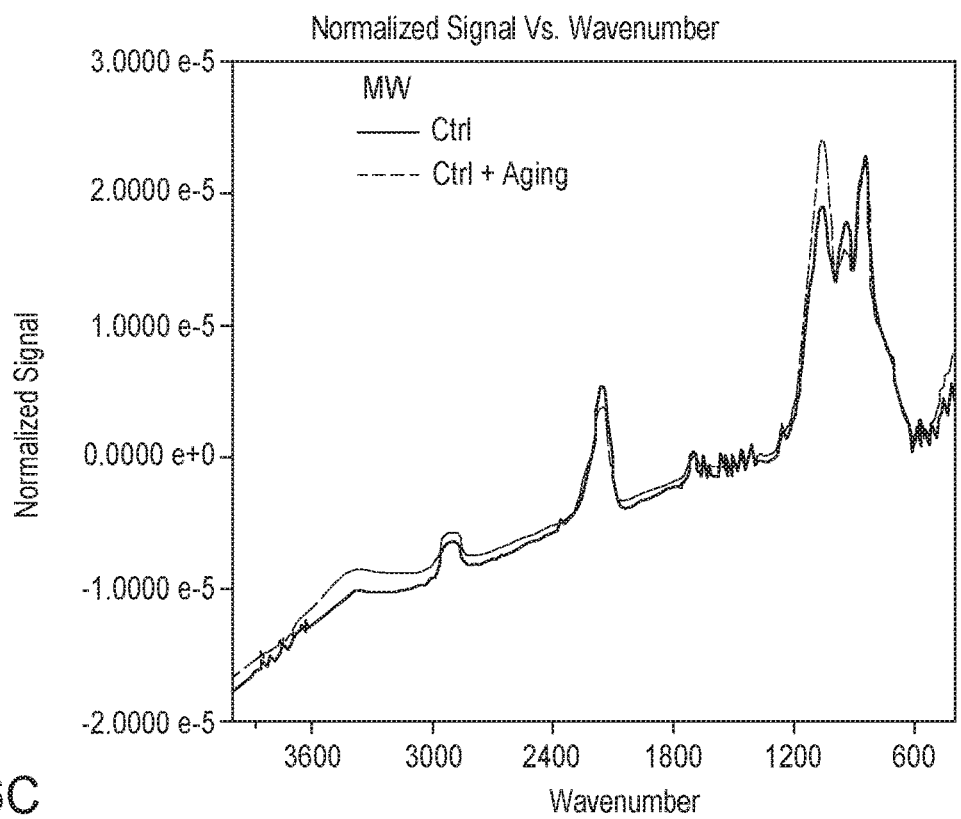
Figure 6D:
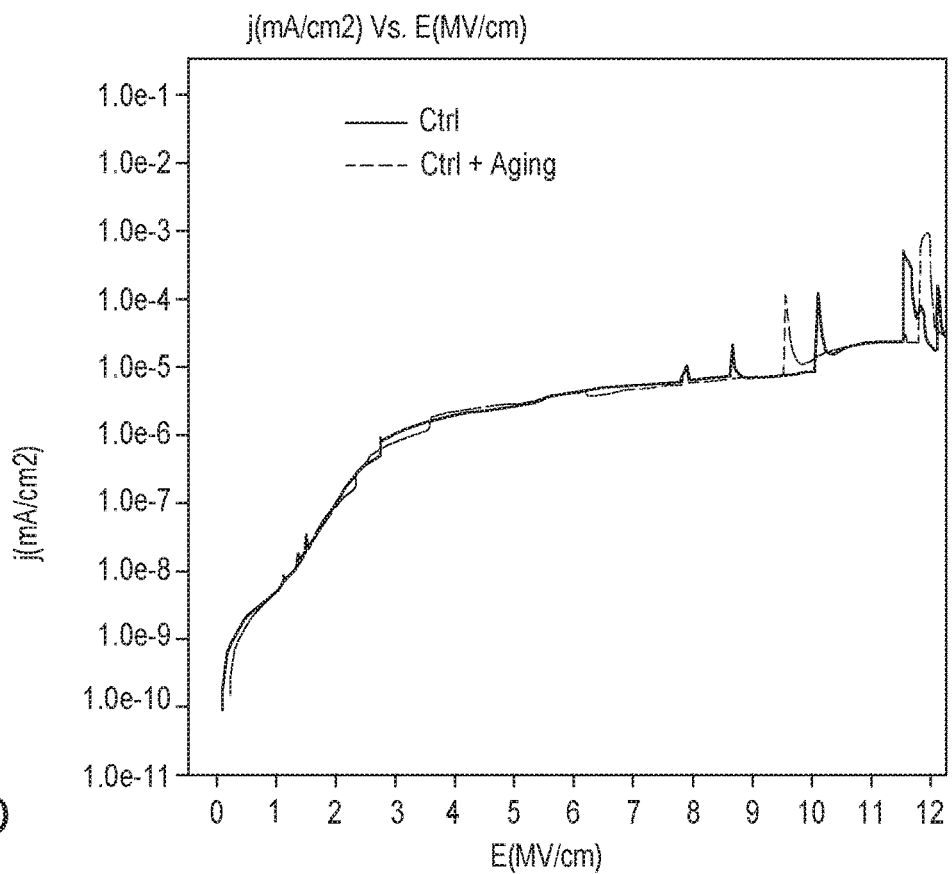
Figure 6E:
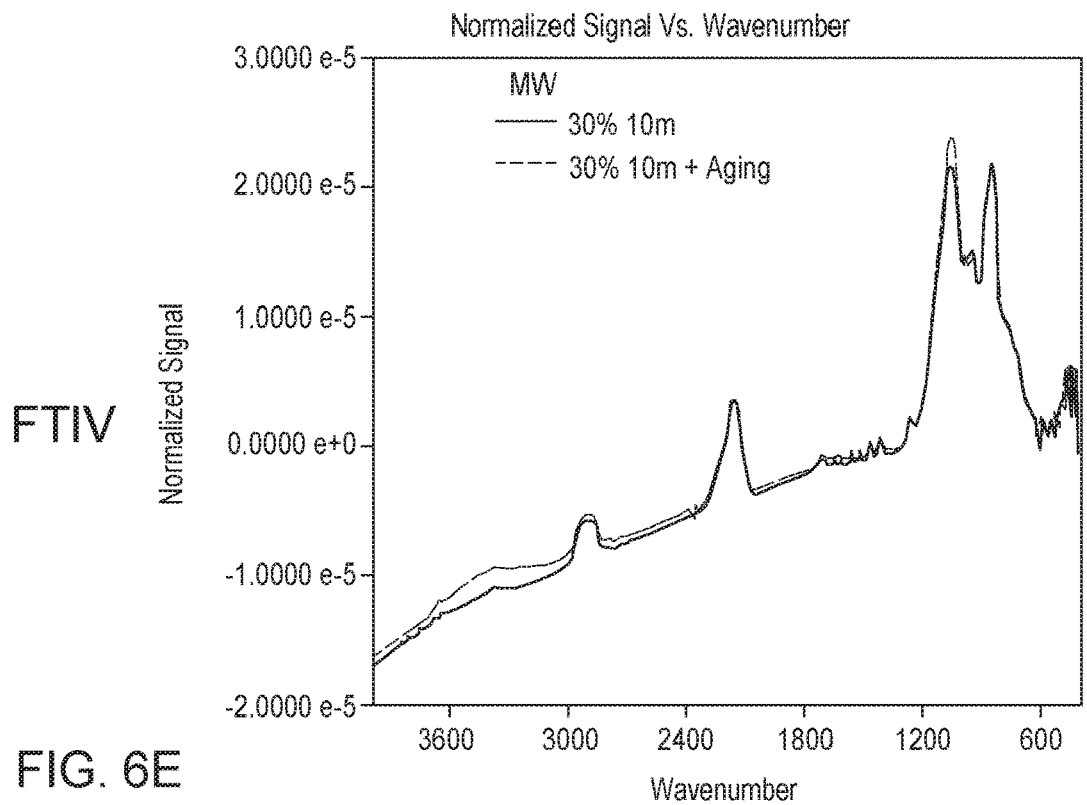
Figure 6F:
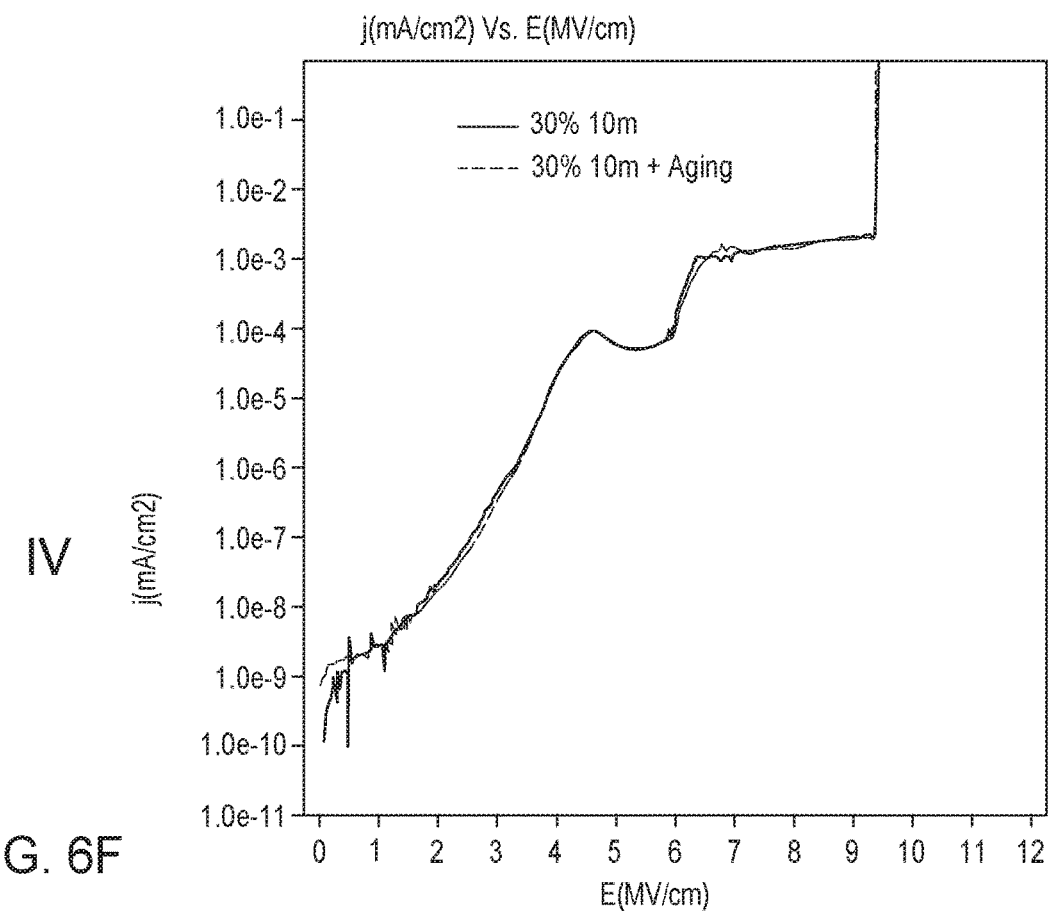
Figure 6G:
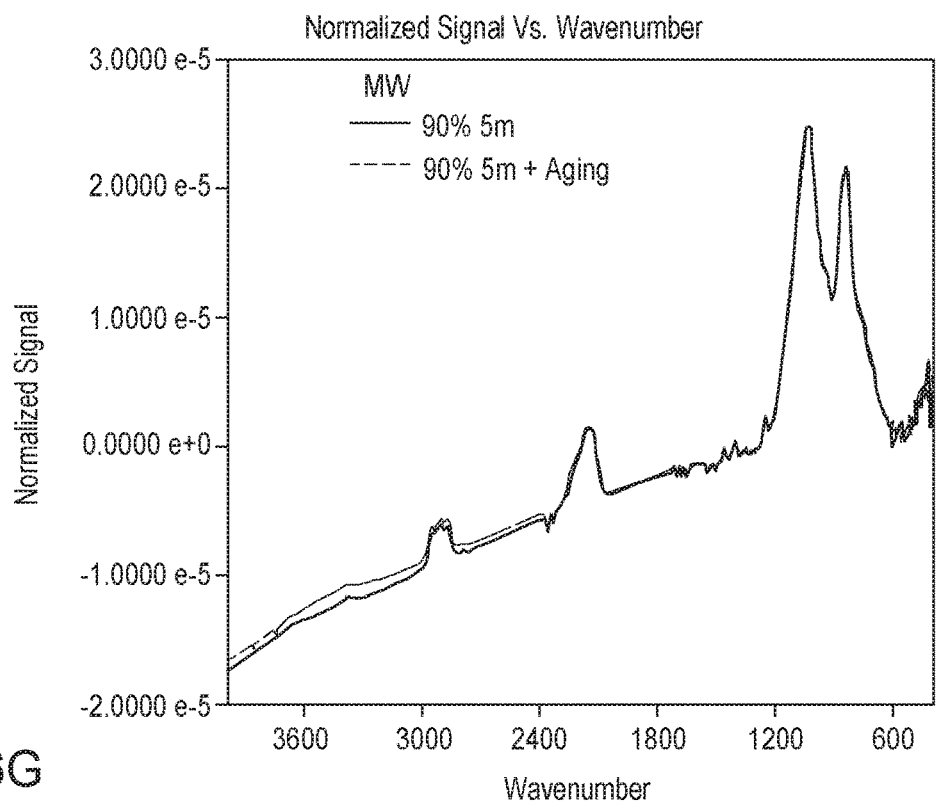
Figure 6H:
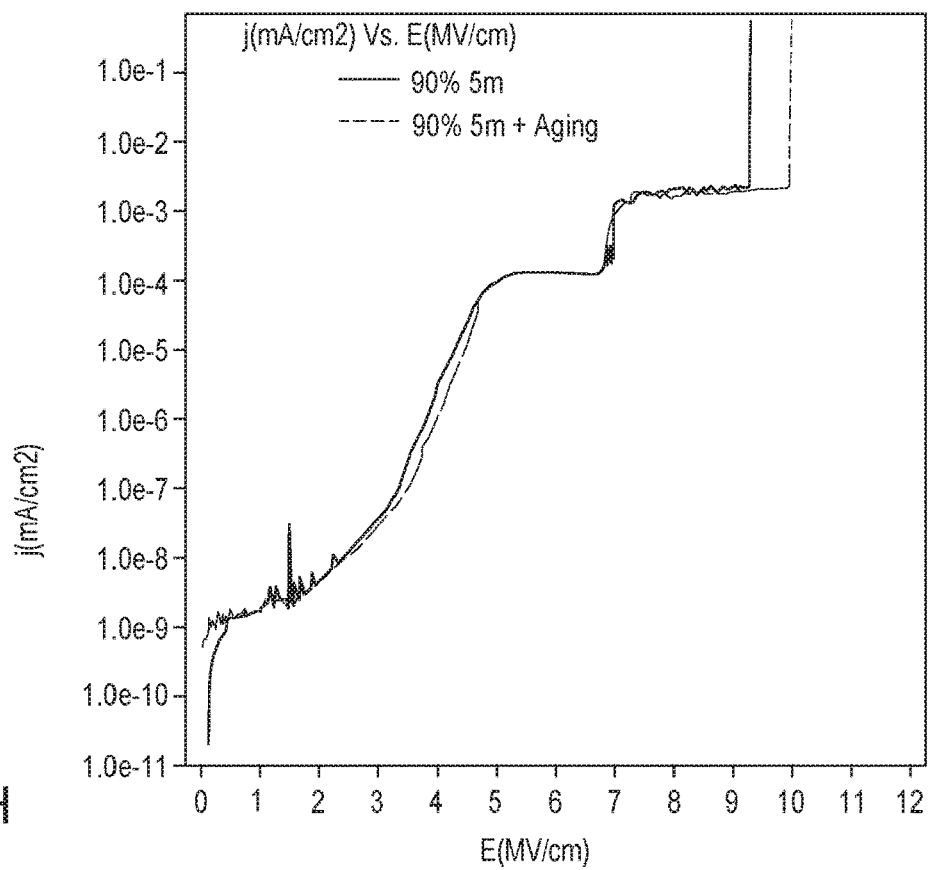
Figure 6I:
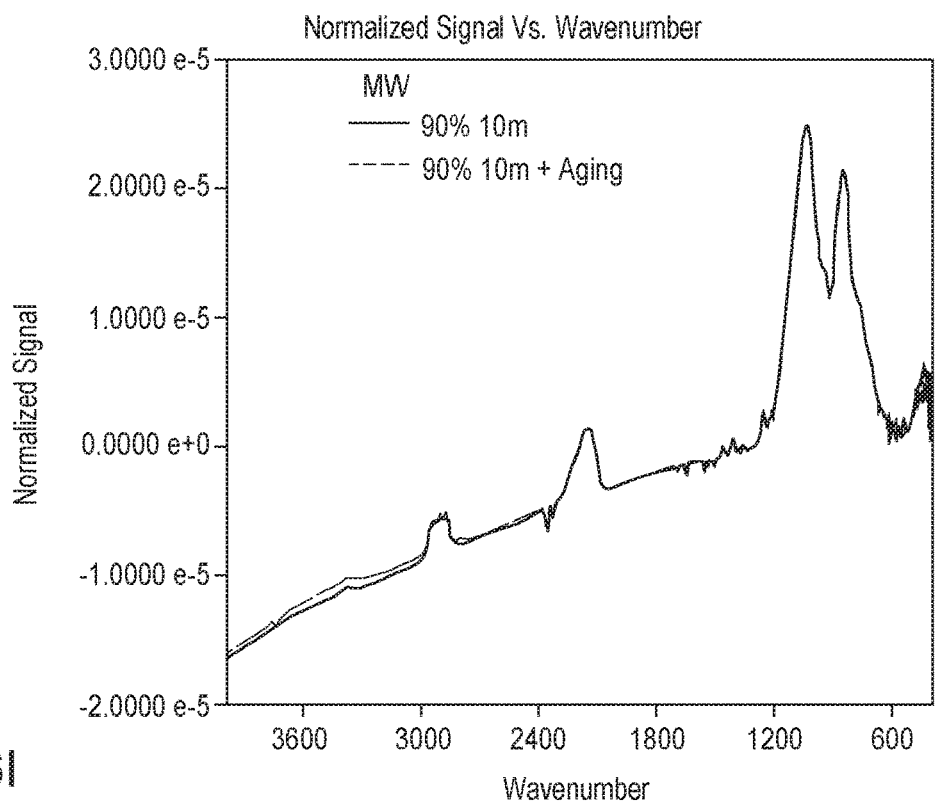
Figure 6J:
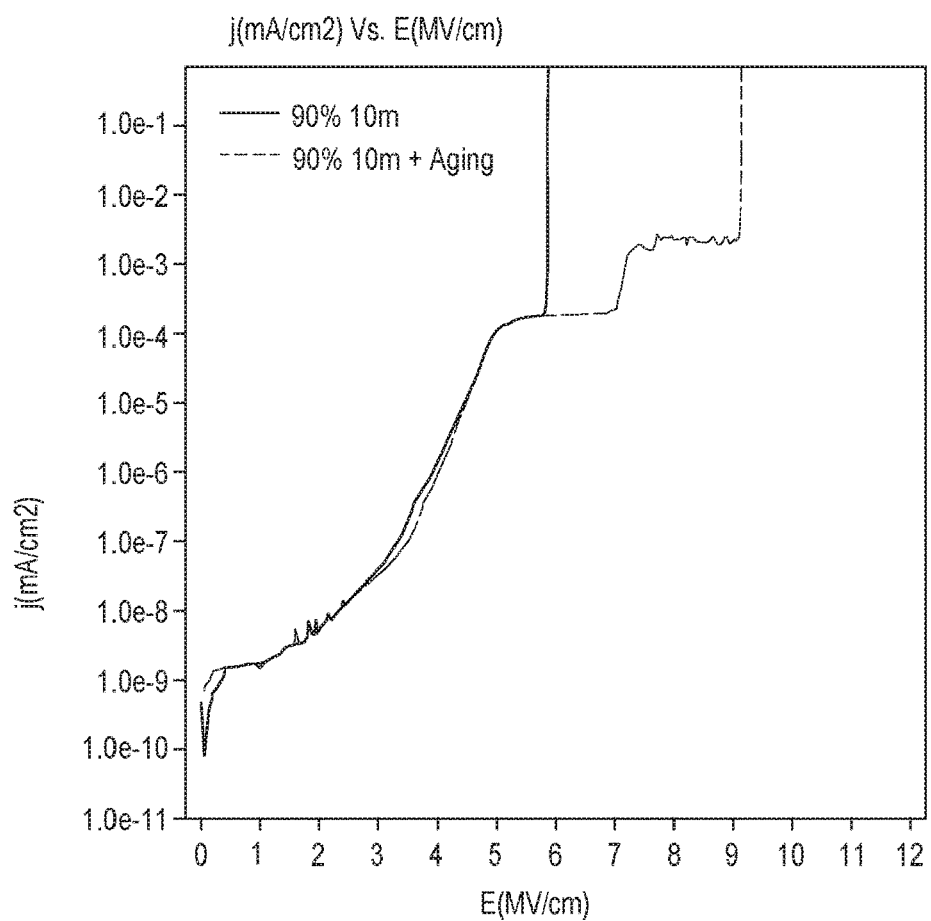

A SiCON-based flowable film was formed on a substrate using a silicon-carbon-and-hydrogen containing organosilicon compound that includes silicon, carbon, and hydrogen, in which each carbon (C) is bonded to two silicon (Si) atoms or a pair of another carbon (C) atom and a hydrogen (H) atom, as the dielectric precursor and oxygen-and-ammonia containing plasma generated in a RPS source by the method 100 described above. The flowable film was further treated with $O_3$ gas for oxidation. The formed flowable film was then exposed to microwave radiation at 5.8 GHz in nitrogen ambient at atmospheric pressure at room temperature. In FIG. 6A, FTIR spectra of the flowable film (i) as delivered, (ii) after 10 minutes of exposure to microwave radiation at 30% of full power (1.6 kW), (iii) after 5 minutes of exposure to microwave radiation at 90% of full power, and (iv) after 10 minutes of exposure to microwave radiation at 90% of full power is shown. As can be seen from FIG. 6A, the peaks in the range of 3400-3200 $cm^{-1}$ corresponding to the vibration frequency of the hydroxyl groups are completely eliminated (iv) after 10 minutes of exposure to microwave radiation at 90% of full power. The peaks in the range of 2280-2080 cm$^{-1}$ corresponding to the vibration frequency of Si—H groups are also reduced after the exposure to microwave radiation As can be seen in FIG. 6B, the exposure to microwave radiation lowers leak current at an applied electric field 2.0 mV/cm from 1.3×10$^{-7}$ mA/cm$^2$ in the flowable film (i) as delivered to 6.9×10$^{-9}$ mA/cm$^2$ in a middle region of the flowable film.

It is known that SiCON-based flowable films as deposited absorb moisture widening the peak in FTIR spectra and worsening electrical property of the flowable film (referred to as aging). FIGS. 6C, 6D, 6E, 6F, 6G, 6H, 6I, and 6J show FTIR spectra and leak current of the SiCON-based flowable film as described above, before and after aging for 2 to 3 days. In the flowable film (i) as delivered, (ii) after 10 minutes of exposure to microwave radiation at 30% of full power, and (iii) after 5 minutes of exposure to microwave radiation at 90% of full power, the aging effects are observed (i.e., the flowable film absorbs moisture), and thus the peaks corresponding to the vibration frequency of the hydroxyl groups and increased leak currents are observed. However, in the flowable film (iv) after 10 minutes of exposure to microwave radiation at 90% of full power, no changes in the FTIR spectra and leak current were observed, and thus this flowable film is robust against aging.

EXAMPLE 3

Figure 7A:
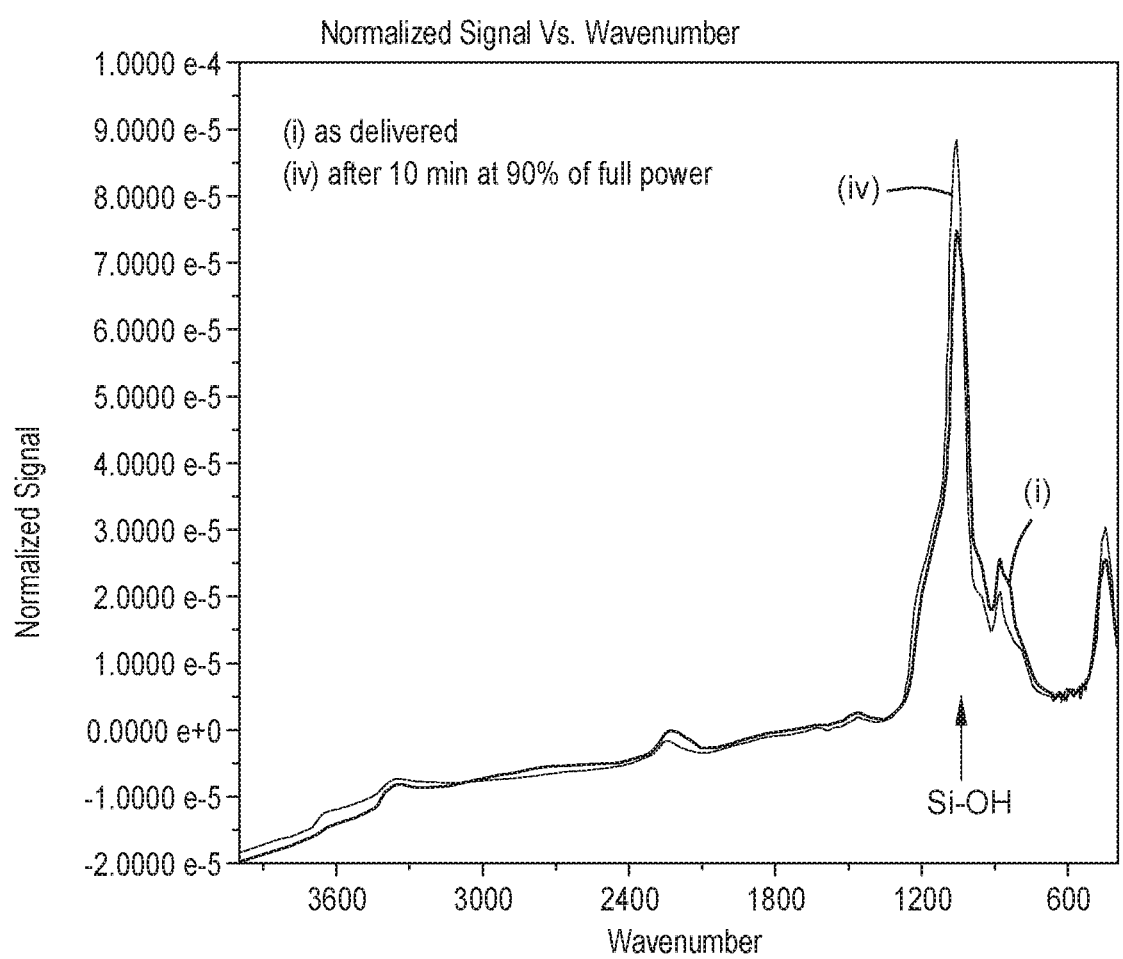
FIGS. 7A, 7B, 7C show FTIR spectra, wet etch rate (WERR), and reflective index/shrinkage of a flowable film according to one embodiment.
Figure 7B:
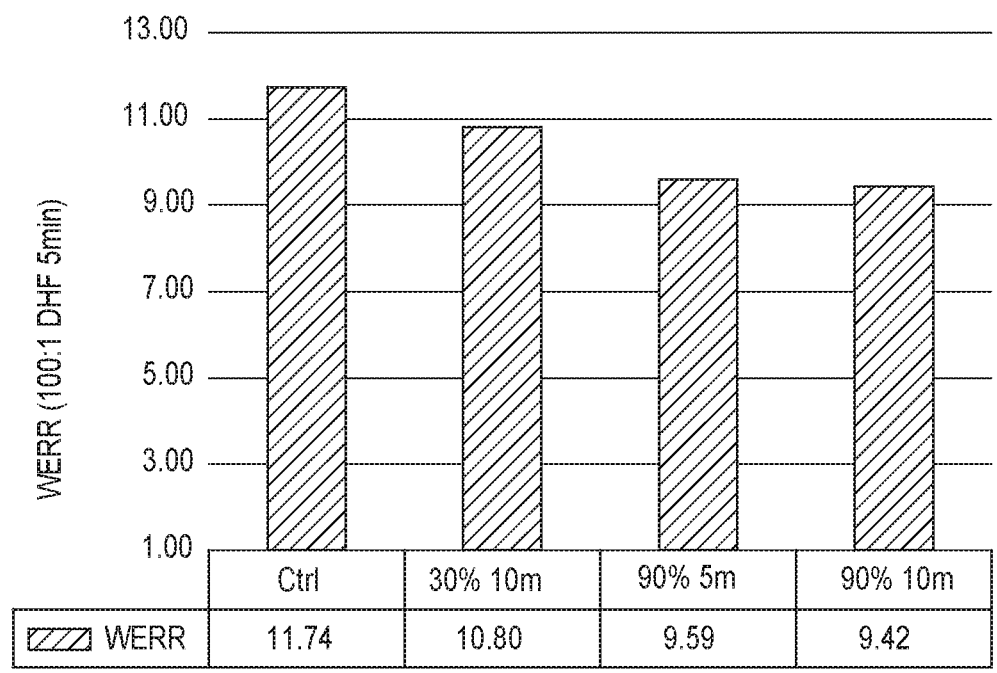
Figure 7C:
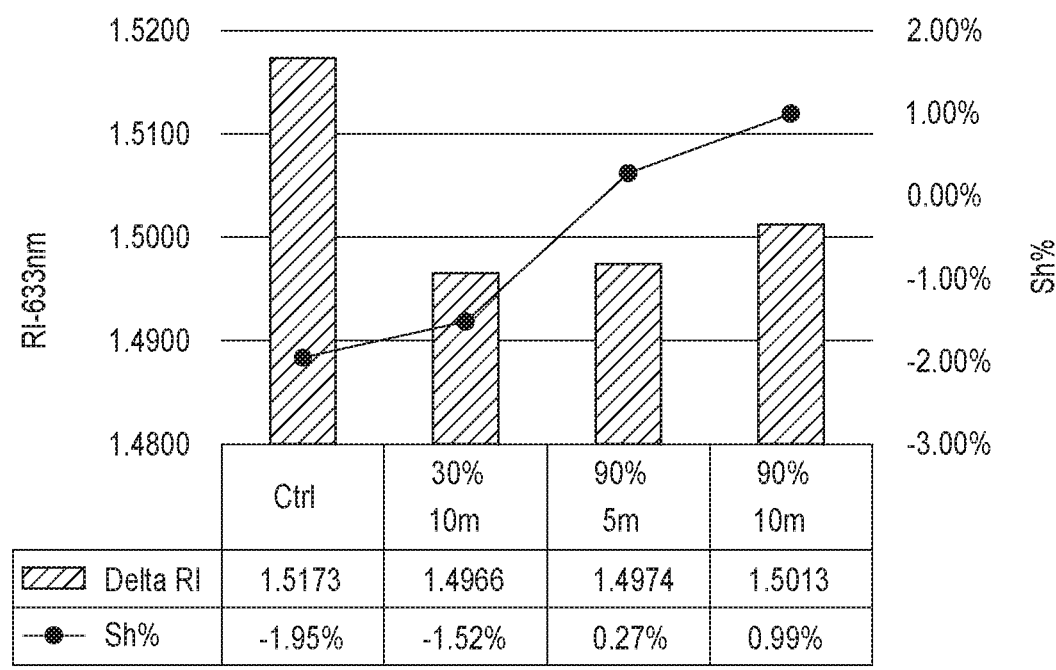

A SiO-based flowable film was formed on a substrate using an organosilicon compound that includes silicon, nitrogen, hydrogen, and chlorine, as the dielectric precursor and oxygen-containing plasma generated in a RPS source by the method 100 described above. The formed flowable film was then exposed to microwave radiation at 5.8 GHz in nitrogen ambient at atmospheric pressure at room temperature. In FIG. 7A, FTIR spectra of the flowable film (i) as delivered and (iv) after 10 minutes of exposure to microwave radiation at 90% of full power (1.6 kW) is shown. As can be seen in FIG. 7A, the peak in the range of 1130-1000 cm$^{-1}$ corresponding to the vibration frequency of siloxane functional group (Si—O—Si) is increased (iv) after 10 minutes of exposure to microwave radiation at 90% of full power, indicating cross-linking of polymers (i.e., by removing hydroxyl groups (—OH) and forming siloxane functional group (Si—O—Si)) in the flowable film is improved. This improvement in the cross-linking can be seen as a decrease in a reflective index and a decrease in a ratio of wet etch rate (WERR) of the flowable film relative to thermal oxide film with diluted hydrofluoric acid (DHF, 100:1) shown in FIGS. 7B and 7C. In the flowable film (i) as delivered, (ii) after 10 minutes of exposure to microwave radiation at 30% of full power, and (iii) after 5 minutes of exposure to microwave radiation at 90% of full power, the wet etch rate varies from 11.74 angstroms per minute (Å/min) to 9.42 (Å/min). The reflective index at wavelength 663 nm is reduced by the microwave treatment down to less than 1.50.

As discussed above, dielectric films may be cured and hydroxyl groups (—OH) may be removed by exposure to microwave radiation, with reduced shrinkage of the dielectric films, as compared to thermal annealing or UV irradiation. The removal of the hydroxyl groups (—OH) leads to decrease in effects of aging, increases in density and strength of the dielectric films. It should be noted that the particular example embodiments described above are only some possible examples of a dielectric film that can be post-treated by microwave radiation according to the present disclosure and do not limit the possible configurations, specifications, deposition methods, or the like of dielectric films. For example, post-treatment by microwave radiation can be applied to any doped or un-doped SiCOH, SiCON, SiO, and SiN films or silicon-containing dielectric films deposited by other methods, such as chemical vapor deposition (CVD) or atomic layer deposition (ALD).

While the foregoing is directed to specific embodiments, other and further embodiments may be devised without departing from the basic scope thereof, and the scope thereof is determined by the claims that follow.

The invention claimed is:

1. A method of post-treating a dielectric film formed on a surface of a substrate, comprising:
   positioning a substrate having a dielectric film formed thereon in a processing chamber; and
   exposing the dielectric film to microwave radiation in the processing chamber at a frequency between 5 GHz and 7 GHz.

2. The method according to claim 1, wherein the dielectric film comprises silicon.

3. The method according to claim 1, wherein the dielectric film comprises hydroxyl groups (—OH).

4. The method according to claim 1, wherein the microwave radiation is at 5.8 GHz.

5. The method according to claim 1, wherein the substrate is at a temperature between room temperature and 450° C. during the exposure of the dielectric film to microwave radiation.

6. The method according to claim 1, wherein the dielectric film is exposed to microwave radiation in ambient gas selected from nitrogen, helium, argon, hydrogen, oxygen, air, and water vapor, at atmospheric pressure.

7. The method according to claim 1, wherein the dielectric film is exposed to microwave radiation at a power density between 0.7 W/cm$^2$ and 7.0 W/cm$^2$ for a time duration between 1 minute and 20 minutes.

8. The method according to claim 1, wherein the substrate is made of a material selecting from a group consisting of metal, semiconductor, and plastic.

* * * * *